(12) United States Patent
Tomita

(10) Patent No.: US 7,898,890 B2
(45) Date of Patent: Mar. 1, 2011

(54) OSCILLATING DEVICE, METHOD OF ADJUSTING THE SAME AND MEMORY

(75) Inventor: Hiroyoshi Tomita, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 181 days.

(21) Appl. No.: 12/145,889

(22) Filed: Jun. 25, 2008

(65) Prior Publication Data

US 2009/0016135 A1    Jan. 15, 2009

(30) Foreign Application Priority Data

Jul. 10, 2007    (JP) .............................. 2007-181367

(51) Int. Cl.
*G11C 7/00* (2006.01)

(52) U.S. Cl. .................... 365/222; 365/192; 365/189.7; 365/210.1; 365/236

(58) Field of Classification Search ................. 365/236, 365/222, 191, 192
See application file for complete search history.

(56) References Cited

U.S. PATENT DOCUMENTS

| 5,594,699 | A | 1/1997 | Nomura et al. |
| 5,867,438 | A | 2/1999 | Nomura et al. |
| 6,097,658 | A | 8/2000 | Satoh et al. |
| 6,329,860 | B1 * | 12/2001 | Komatsu .................. 327/291 |
| 6,452,459 | B1 | 9/2002 | Chan et al. |
| 6,930,946 | B2 * | 8/2005 | Otsuka et al. .............. 365/222 |
| 2002/0177267 | A1 | 11/2002 | Beer et al. |
| 2003/0227307 | A1 * | 12/2003 | Le et al. .................... 327/156 |
| 2006/0023545 | A1 * | 2/2006 | Ito et al. .................... 365/222 |

FOREIGN PATENT DOCUMENTS

| GB | 2 350 949 A | 12/2000 |
| JP | 7-220473 A | 8/1995 |
| JP | 09-171682 | 6/1997 |
| JP | 2002-074994 | 3/2002 |

* cited by examiner

*Primary Examiner*—Pho M Luu
*Assistant Examiner*—Tha-O Bui
(74) *Attorney, Agent, or Firm*—Fujitsu Patent Center

(57) ABSTRACT

An oscillating device including: an oscillator generating an oscillation signal according to an enable signal; a counter counting an oscillation number of the oscillation signal and being able to reset at the oscillation number indicated by a first signal; and a comparator comparing the counted oscillation number and a reference number, is provided.

11 Claims, 9 Drawing Sheets

F I G. 3
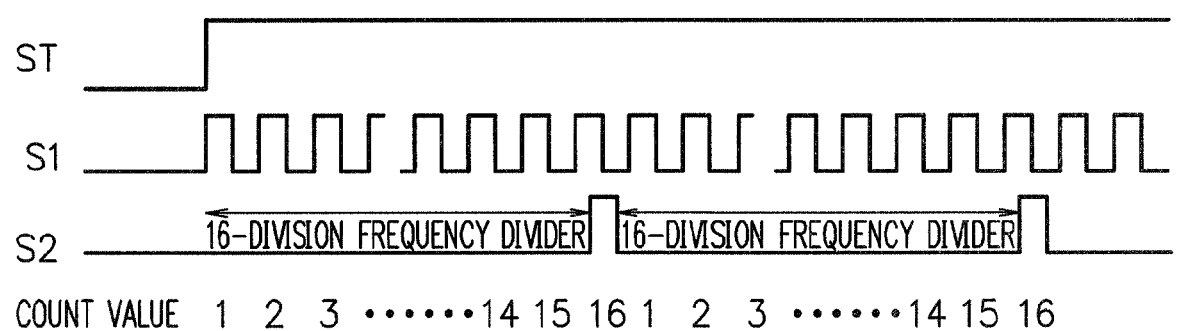

US 7,898,890 B2

OSCILLATING DEVICE, METHOD OF ADJUSTING THE SAME AND MEMORY

CROSS-REFERENCE TO RELATED APPLICATIONS

This application is based upon and claims the benefit of priority from the prior Japanese Patent Application No. 2007-181367, filed on Jul. 10, 2007, the entire contents of which are incorporated herein by reference.

BACKGROUND OF THE INVENTION

1. Field of the Invention

This application relates to an oscillating device, a method of adjusting the oscillating device and a memory.

2. Description of the Related Art

A memory is provided with an oscillator to generate a self-refresh request signal. The oscillator creates variations in the cycle of the oscillation due to process variations. Accordingly, the refresh time required for each semiconductor chip differs from each other. In order to solve this problem, in a probing test, oscillation cycle measurement of oscillators for self refresh is conducted for every semiconductor chip, and according to each cycle, the frequency division number is changed for every semiconductor chip, so that the generation interval of a refresh request signal needs to be adjusted. By doing it in this manner, the variation in required refresh time for every semiconductor chip is reduced.

Japanese Patent Application Laid-open No. Hei 9-171682, Japanese Patent Application Laid-open No. 2002-74994 and Japanese Patent Application Laid-open No. Hei 7-220473 describe a semiconductor memory including a oscillation circuit.

SUMMARY OF THE INVENTION

According to one aspect of an embodiment, an oscillating device is provided which comprises: an oscillator generating an oscillation signal according to an enable signal; a counter counting a oscillation number of the oscillation signal and resetting at the oscillation number indicated by a first signal; and a comparator comparing the counted oscillation number and a reference number.

BRIEF DESCRIPTION OF THE DRAWINGS

FIG. 3 is a view explaining a method of adjusting a cycle of a refresh request signal of the oscillating device in FIG. 2;

DETAILED DESCRIPTION OF THE PREFERRED EMBODIMENTS

Figure 1:
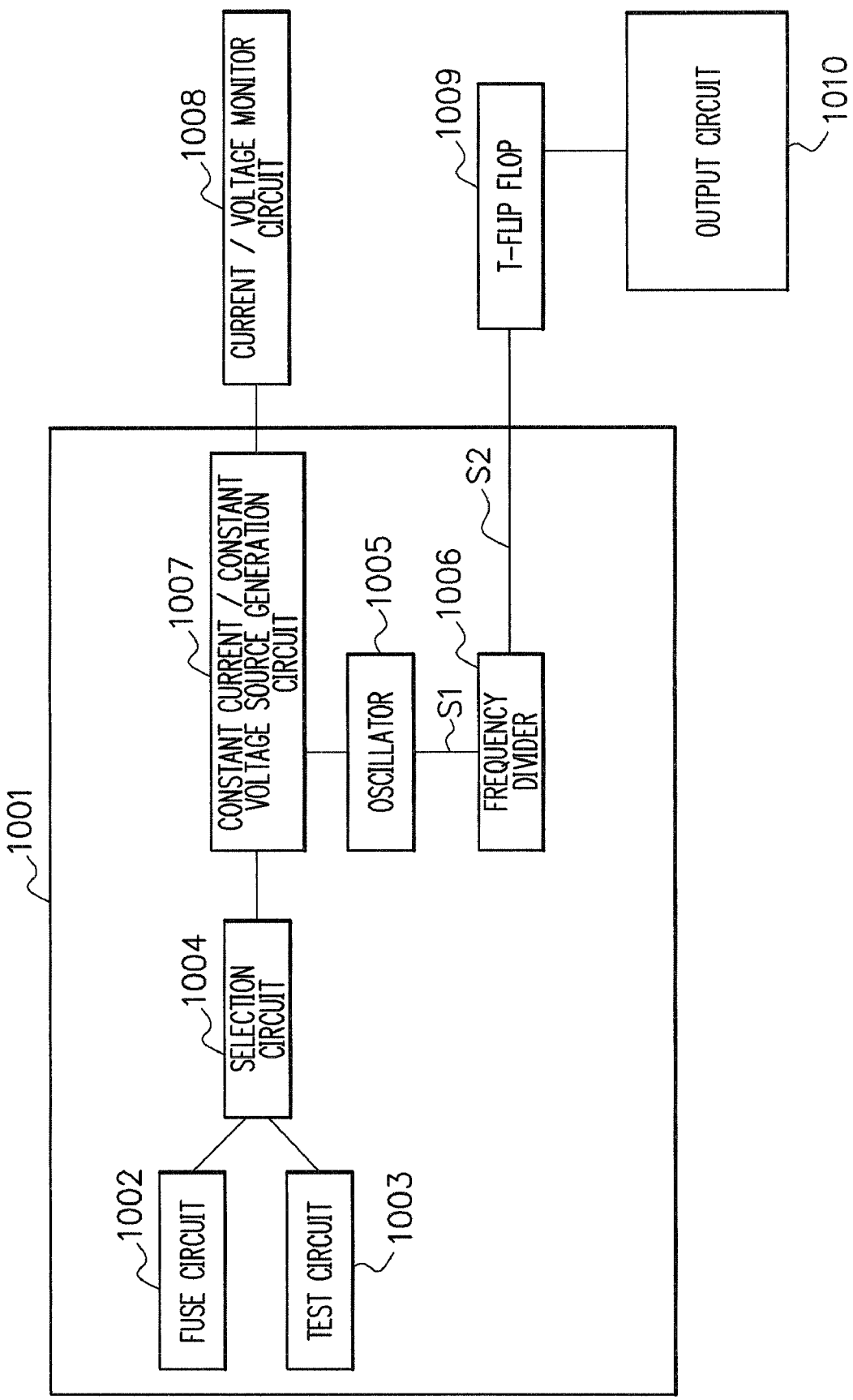
FIG. 1 is a block diagram showing a structural example of an oscillating device.

FIG. 1 is a block diagram showing a structural example of an oscillating device. A refresh request signal generation circuit 1001 generates a refresh request signal S2. First, a cycle adjustment method of the refresh request signal S2 will be explained. In a test mode, a test circuit 1003 indicates a constant-current value or a constant-voltage value to a constant-current/constant-voltage source generation circuit 1007 via a selection circuit 1004. The constant-current/constant-voltage source generation circuit 1007 outputs a constant-current or a constant-voltage of an indicated value to an oscillator 1005. The oscillator 1005 generates a signal at a cycle corresponding to the constant-current value or the constant-voltage value and outputs an oscillation signal S1. A frequency divider 1006 divides the oscillation signal S1 and outputs the refresh request signal S2 to a T-type flip-flop 1009. The flip-flop 1009 stores the refresh request signal S2 and outputs it to the outside via an output circuit 1010. The constant current or the constant voltage of the test circuit 1003 is adjusted so that the refresh request signal S2 gets a desired cycle and a constant-current value or a constant-voltage value at the time when the refresh request signal S2 gets the desired cycle is checked using a current/voltage monitor circuit 1008. The constant-current value or the constant-voltage value is written in a fuse circuit 1002. In a normal mode, the fuse circuit 1002 indicates the constant-current value or the constant-voltage value to the constant-current/constant-voltage source generation circuit 1007 via the selection circuit 1004. Thereby, the refresh request signal generation circuit 1001 can generate the refresh request signal S2 of the desired cycle.

Figure 2:
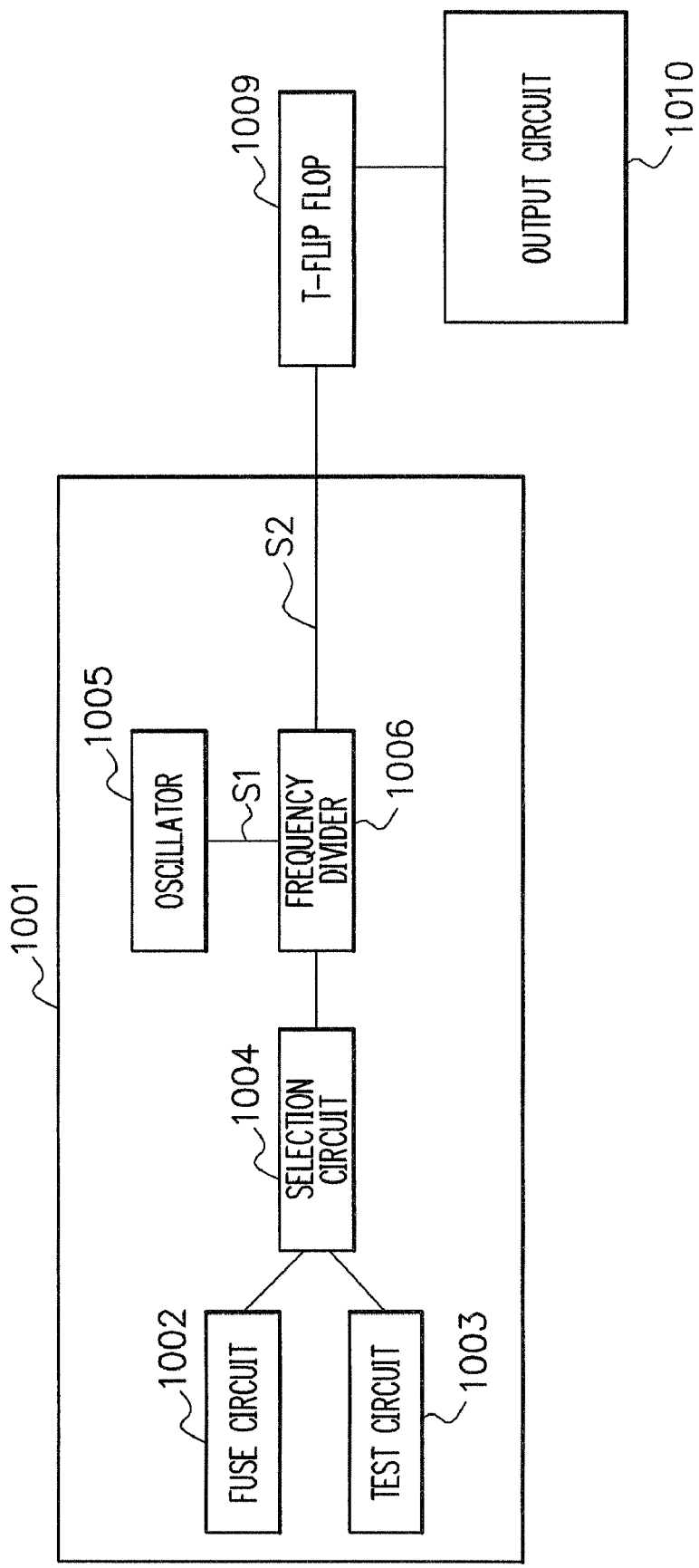
FIG. 2 is a block diagram showing a structural example of another oscillating device.

FIG. 2 is a block diagram showing a structural example of another oscillating device, in which the constant-current/constant-voltage source generation circuit 1007 and the current/voltage monitor circuit 1008 are deleted from FIG. 1. The point where the oscillating device in FIG. 2 differs from the oscillating device in FIG. 1 will be explained here. In a test mode, the test circuit 1003 indicates the frequency division number to the frequency divider 1006 via the selection circuit 1004. The oscillator 1005 outputs the oscillation signal S1. The frequency divider 1006 divides the oscillation signal S1 by an indicated frequency division number and outputs the refresh request signal S2 to the T-type flip-flop 1009. The flip-flop 1009 outputs the refresh request signal S2 to the outside via the output circuit 1010.

FIG. 3 is a view explaining a method of adjusting a cycle of the refresh request signal S2 of the oscillating device in FIG. 1. The oscillator 1005 starts outputting the oscillation signal S1 when an enable signal ST reaches a high level. The frequency divider 1006 outputs the refresh request signal S2 by dividing the oscillation signal S1, for instance, by 16 divisions. In FIG. 3, the count value of an oscillation number (pulse number) of the oscillation signal S1 is shown below the refresh request signal S2. The oscillation signal S1 has a variation in cycle of the refresh request signal S2 between 12 μs to 20 μs, when the oscillation cycle is, for instance, 1 μs and has the accuracy of, for instance, ±25% (variation due to a process variation). It is necessary to secure the refresh current with a current having a 12 μs cycle and the refresh characteristic with 20 μs. A method to change a frequency division number for each of the respective semiconductor chips is taken to solve the problem.

A semiconductor chip having got the refresh request signal S2 of 12 μs cycle changes the frequency division number from 16 to about 21 (=16×16/12), and the cycle of the refresh request signal S2 is set to be about 16 (=21×12/16) μs. Further, a semiconductor chip getting the refresh request signal S2 of 20 μs cycle changes the frequency division number from 16 to about 13 (=16×16/20), and the cycle of the refresh request signal S2 is set at about 16 (=13×20/16) μs. The above changed frequency division numbers are written into the fuse circuit 1002.

The output circuit 1010 outputs the refresh request signal S2, the signal level from the start of measurement to the end of the hold time is measured to conduct a pass/fail judgment. This measurement is repeated several times while changing the hold time, which produces the problem of extended measuring time.

Figure 4:
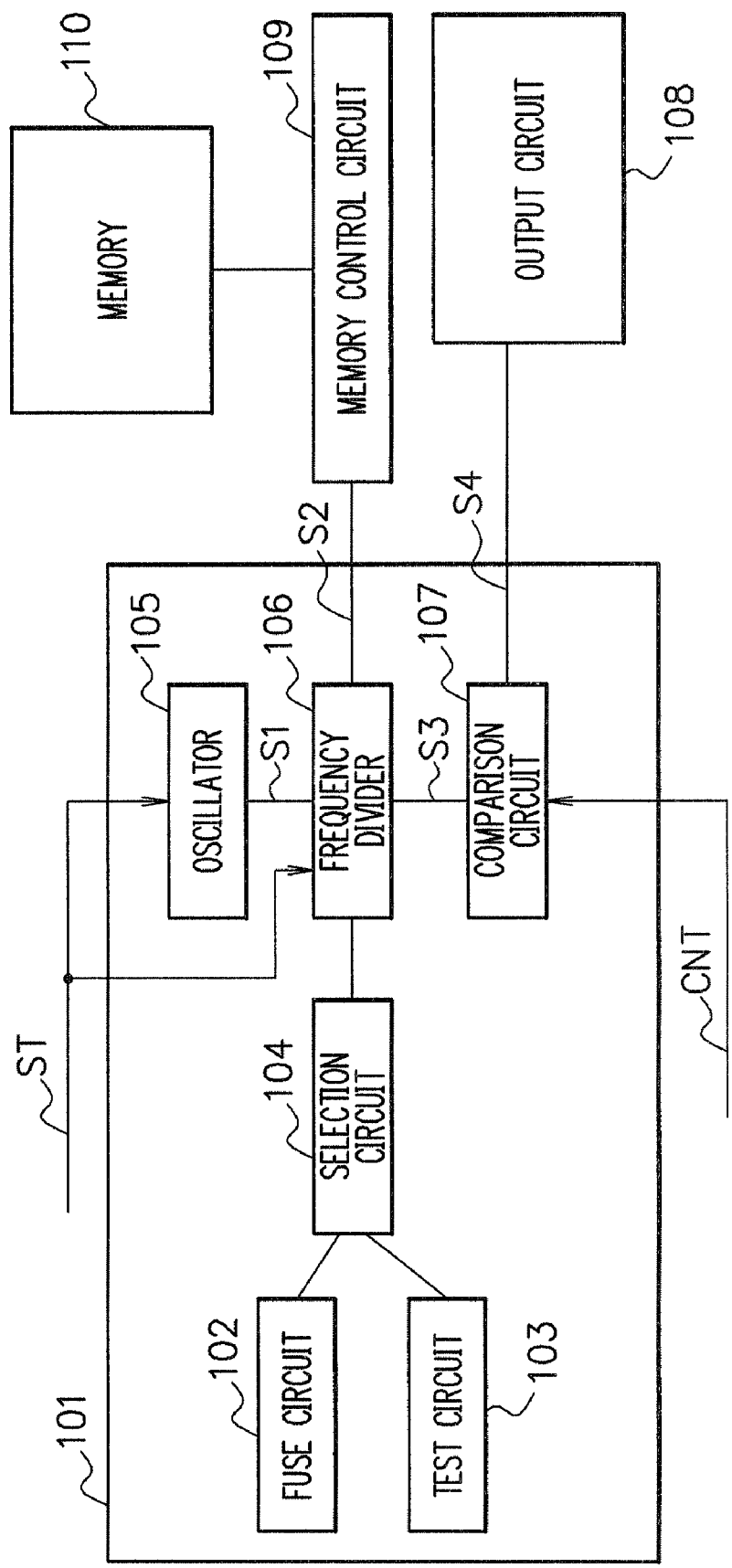
FIG. 4 is a block diagram showing a structural example of a memory according to a first embodiment.
Figure 5:
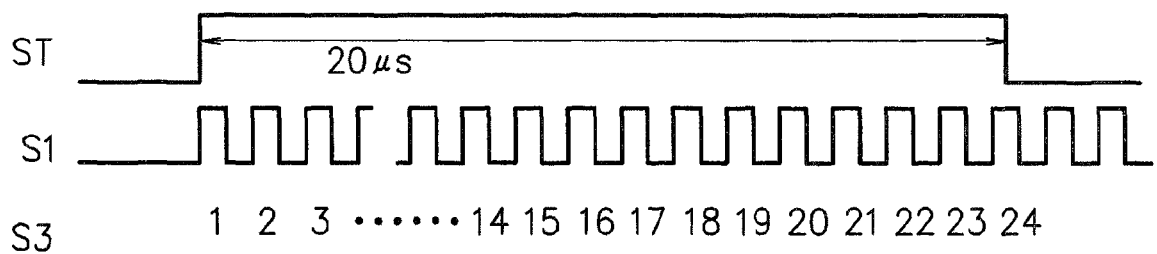
FIG. 5 is a timing chart explaining the operation of the memory.

FIG. 4 is a block diagram showing a structural example of a memory according to a first embodiment, and FIG. 5 is a timing chart explaining the operation of the memory. An oscillating device 101 includes a fuse circuit 102, a test circuit 103, a selection circuit 104, an oscillator 105, a frequency divider 106 and a comparison circuit 107, and generates a refresh request signal S2. The oscillating device 101 has a test mode and a normal mode. First, the adjustment method of the cycle of the refresh request signal S2 in test mode will be explained. The test circuit 103 outputs the frequency division number in test mode. For instance, the frequency division number outputted by the test circuit 103 can be controlled from outside. In test mode, the selection circuit 104 selects a frequency division number outputted by the test circuit 103 and outputs it to the frequency divider 106. The fuse circuit 102, the test circuit 103 and the selection circuit 104 are a setting unit to set a frequency division number of the frequency divider 106. The oscillator 105 generates an oscillation signal S1 according to the enable signal ST. Concretely, the oscillator 105 generates an oscillation signal and starts outputting the oscillation signal S1 when the enable signal ST reaches a high level. The first frequency divider 106 includes a counter and divides the oscillation signal S1 by the frequency division number outputted from the selection circuit 104 to output the refresh request signal (a first frequency division signal) S2, and counts the oscillation number (pulse number) of the oscillation signal S1 to output a count value S3. When the enable signal ST reaches a high level, the frequency divider 106 resets the count value S3 to 0 (zero), and when the enable signal ST reaches a low level, the frequency divider 106 stops counting the count value S3 to keep the count value S3. It should be noted that the oscillator 105 may stop outputting the oscillation signal S1 when the enable signal ST reaches a low level.

For instance, the period during which the enable signal ST is at a high level is 20 μs. This high level period can be changed. The frequency divider 106 counts the count value S3 of the oscillation signal S1 during the time when the enable signal ST is at a high level. For instance, during a 20 μs period during which the enable signal ST is at a high level, the count value S3 is 24. The frequency divider (counter) 106 can decide to reset or not depending on the frequency division number (the oscillation number indicated by the first signal) indicated by the test circuit 103. In test mode, not resetting is selected and in normal mode, resetting is selected. It should be noted that the test circuit 103 may output a frequency division number larger than 24. The cycle of the oscillation signal S1 is a value obtained from the high level period (20 μs) of the enable signal ST divided by the count value S3.

Since the count value S3 is a whole number, however, when the oscillation number is between 24 and 25, the count value at that time is 24, which brings about errors. The oscillation number of the oscillation signal S1 is between 20 μs/24 and 20 μs/25. In this case, the maximum error of the oscillation signal S1 is 20 μs/24−20 μS/25=20 μs/(24×25).

This error can be reduced by extending the high level period of the enable signal ST. For instance, assuming that the high level period of the enable signal ST is 200 μs, the count value S3 is about 240, and the maximum error of the cycle of the oscillation signal S1 is 200 μs/240−200 μs/241=200 μs/(240×241). Accordingly, the maximum error in the cycle of the oscillation signal S1 can be reduced by one digit compared with the case of the high level period of the enable signal ST being 20 μs. Thus, it is possible to measure the cycle of the oscillation signal S1 with a high degree of accuracy with one measurement.

The comparison circuit (comparator) 107 compares the count value S3 and a reference number CNT and outputs a comparison result signal S4. The comparison result signal S4 becomes a coincidence signal when the count value S3 and the reference number CNT coincide with each other, and becomes a inconsistency signal when the count value S3 does not coincide with the reference number CNT. For instance, the reference number CNT is an external signal, and it is possible to input it from the outside as an address, for instance, using an address wire. An output circuit 108 is an output buffer and outputs the comparison result signal S4 to the outside. The reference numbers CNT are varied and a reference number CNT which makes the comparison result signal S4 a coincidence signal is detected. The reference number CNT, which the comparison result signal S4 coincides with, is detected as an oscillation number (count value) of the oscillation signal S1.

In order to detect the count value S3 using an external address as the reference number CNT, the counter of the frequency divider 106 is structured with a binary counter. In the above-described case, since the count value S3 is 24 which is 11000 (binary number), the count value S3 is detectable by being compared with the addresses A10 to A0 (=LLL, LLLH, and HLLL). Here, L (low level) represents 0 and H (high level) represents 1.

Figure 6:
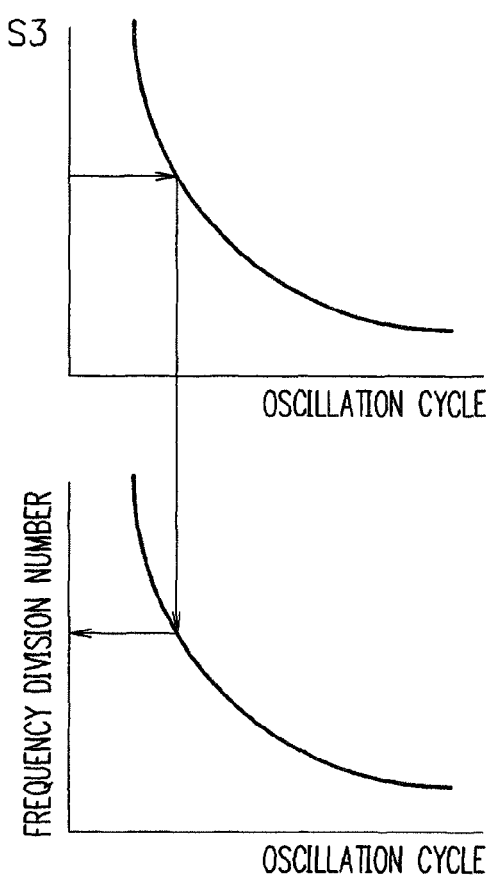
FIG. 6 is a graph explaining a method of setting a frequency division number of a fuse circuit based on a count value of a frequency divider.

FIG. 6 is a graph explaining the method of setting the frequency division number of the fuse circuit 102 based on the count value S3 of the frequency divider 106. The count value S3 of the frequency divider 106 can be detected using the above-described method. As in a graph shown in the upper part of FIG. 6, by dividing the high level period of the enable signal ST by the count value S3, the oscillation cycle of the oscillation signal S1 can be obtained. Next, as in the graph shown in the lower part of FIG. 6, a frequency division number can be obtained by dividing the cycle of a desired refresh request signal S2 by the oscillation cycle of the oscillation signal S1. This frequency division number is written in the fuse circuit 102. The fuse circuit 102 is a laser fuse circuit or an electric fuse circuit, and stores the frequency division number.

Practically, a corresponding table between the count value S3 and the frequency division number of the frequency divider 106 is prepared beforehand, the frequency division number is determined from the count value S3 of the frequency divider 106 using the corresponding table, and the frequency division number is set to the fuse circuit 102 by cutting the fuse.

A large frequency division number means a short oscillation cycle, and in order to establish the above-described frequency division number, it is necessary to set the frequency division number larger than the frequency division number at the time of the refresh test. In other words, it is necessary that the cycle of the refresh request signal S2 according to the frequency division number set at the fuse circuit 102 is reduced more than the cycle of the refresh request signal S2 according to the frequency division number at the time of the refresh test so that the condition is made rigorous.

Next, the method of generating the refresh request signal S2 in normal mode will be explained. The fuse circuit 102 outputs the written frequency division number. In normal mode, the selection circuit 104 selects a frequency division number outputted by the fuse circuit 102 and outputs it to the frequency divider 106. The oscillator 105 generates the oscillation signal S1 according to the enable signal ST. The frequency divider 106 divides the oscillation signal S1 by the frequency division number outputted by the selection circuit 104, and outputs the refresh request signal S2 (refer to FIG. 3). Thus, the refresh request signal S2 of the desired cycle can be generated and variation in the cycles of the refresh request signal S2 can be prevented.

A memory 110 is, for instance, a DRAM or a pseudo SRAM for which a refresh operation is required, and it stores data. A memory control circuit (memory controller) 109 conducts a refresh operation to the memory 110 based on the refresh request signal S2. The refresh operation is that to supply charge lest memory such as a DRAM should be lost. The DRAM, which is a kind of a semiconductor memory, keeps information by reserving charge in a capacitor. Since this charge decreases as time passes, if kept alone, it loses the whole store of information completing discharge in a certain time. In order to prevent this phenomenon, it is necessary to conduct a refresh operation to supply charge to the DRAM at regular intervals.

As described above, the present embodiment can measure the cycle of the oscillation signal S1 in one measurement with high accuracy, and variations in the cycle of the refresh request signal S2 can be prevented with ease.

Figure 7:
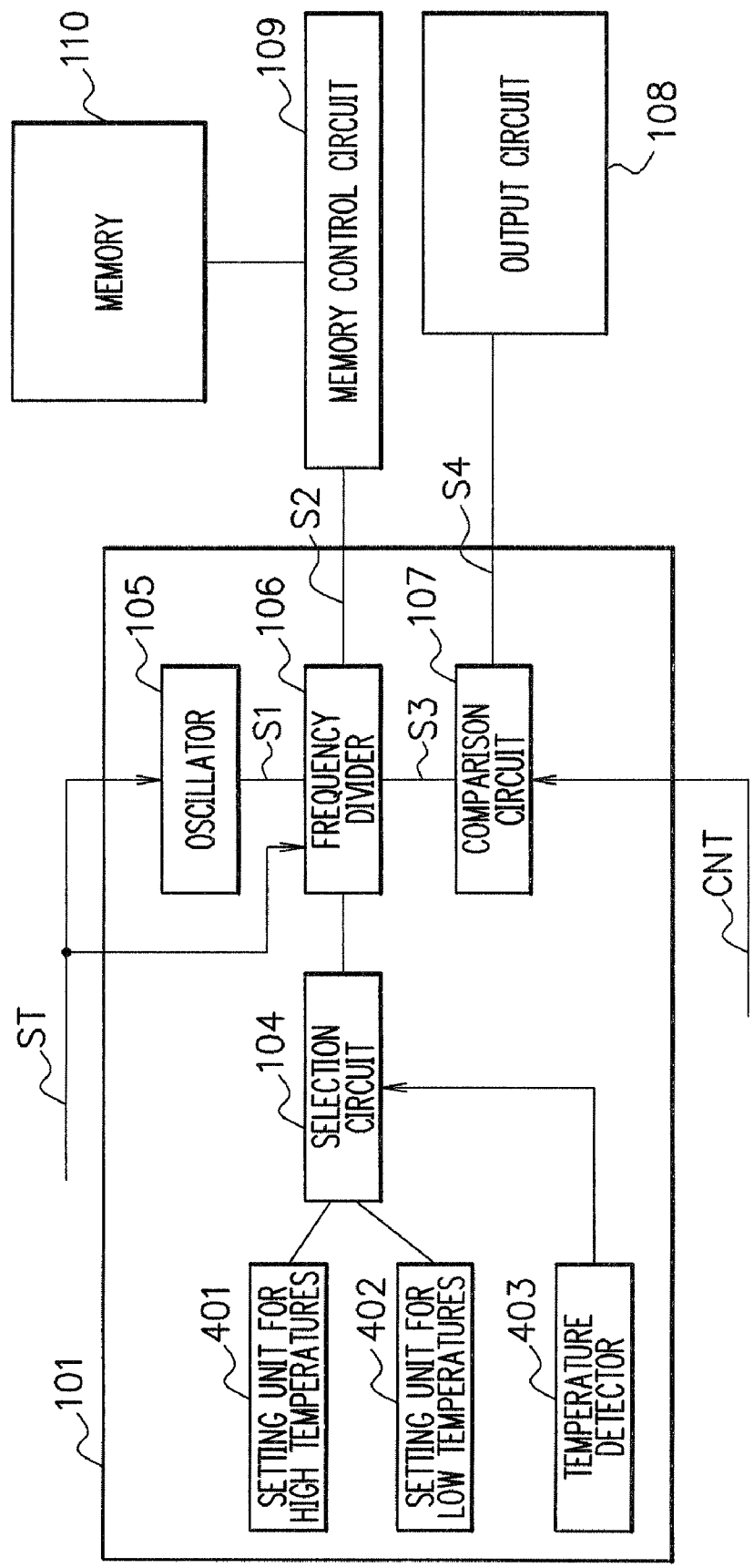
FIG. 7 is a block diagram showing a structural example of a memory according to a second embodiment.

FIG. 7 is a block diagram showing a structural example of a memory according to the second embodiment. The present embodiment (FIG. 7) has the addition of a setting unit for high temperatures 401, a setting unit for low temperatures 402 and a temperature detector 403 to the first embodiment (FIG. 4). The differences in the present embodiment from those in the first embodiment will be explained below. It is preferable that the cycle of the refresh request signal S2 is changed in accordance with temperature. It is preferable for the memory 110 that since discharge speed of stored charge is faster at high temperatures, the cycle of the refresh request signal S2 is shortened by lowering the frequency division number and since the discharge speed of the stored charge is slow at low temperatures, the cycle of the refresh request signal S2 is lengthened by increasing the frequency division number. Thereby, it is possible to reduce the consumption of electricity. A small frequency division number during times of high temperature is stored in the setting unit for high temperatures 401, and a large frequency division number during times of low temperature is stored in the setting unit for low temperatures 402. The setting units for high temperatures and for low temperatures 401 and 402 include the fuse circuit 102 and the test circuit 103 in FIG. 4 respectively. The temperature detector 403 detects temperatures. The selection circuit 104 selects a frequency division number outputted by the setting unit for high temperatures 401 when the temperature detected by the temperature detector 403 is higher than the threshold value, selects a frequency division number outputted by the setting unit for low temperatures 402 when the temperature detected by the temperature detector 403 is lower than the threshold value, and outputs it to the frequency divider 106. The setting unit for high temperatures 401, the setting unit for low temperatures 402 and the selection circuit 104 are the setting sections setting the frequency division number of the frequency divider 106 according to the temperature detected by the temperature detector 403.

First, at high temperatures (first temperature), an operation in test mode of the first embodiment is conducted to detect the count value S3 of the oscillation signal S1. Then, as the above-described explanation of FIG. 6, a frequency division number of a high temperature is determined based on the count value S3. Here, the cycle of the refresh request signal S2 during high temperatures is short. Next, the frequency division number is recorded and set in the fuse circuit 102 in the setting unit for high temperatures 401.

Next, at low temperatures (second temperature), an operation in test mode of the first embodiment is conducted to detect the count value S3 of the oscillation signal S1. Then, as the above-described explanation of FIG. 6, a frequency division number of a low temperature is determined based on the count value S3. Here, the cycle of the refresh request signal S2 during low temperatures is long. Next, the frequency division number is recorded and set in the fuse circuit 102 in the setting unit for low temperatures 402.

In normal mode, the oscillating device 101 generates the refresh request signal S2 similarly to the first embodiment. The selection circuit 104 selects a frequency division number outputted by the fuse circuit 102 in the setting unit for high temperatures 401 when the temperature detected by the temperature detector 403 is higher than a threshold value, and selects a frequency division number outputted by the fuse circuit 102 in the setting unit for low temperatures 402 when the temperature detected by the temperature detector 403 is lower than a threshold value and outputs it to the frequency divider 106. The frequency divider 106 divides the oscillation signal S1 by the frequency division number outputted by the selection circuit 104, and outputs the refresh request signal S2.

The present embodiment enables the measurement of the cycle of the oscillation signal S1 with high accuracy in one measurement similarly to the first embodiment, so that it is possible to easily prevent variation in the cycle of the refresh request signal S2.

It should be noted that in the above description, the case of conducting measurement of both frequency division numbers at times of high temperatures and low temperatures is explained as an example, it is also possible to conduct measurement only for one temperature direction, up or down. For instance, only the frequency division number at a high temperature is measured, and the frequency division number at a low temperature may be written in the setting unit for low temperatures 402 as a frequency division number created by multiplying a coefficient to a frequency division number at a high temperature. In addition, in the case of setting a frequency division number for each temperature region by dividing the temperature region into two regions of high temperature and low temperature, frequency division numbers may be set for three or more temperature regions.

Figure 8:
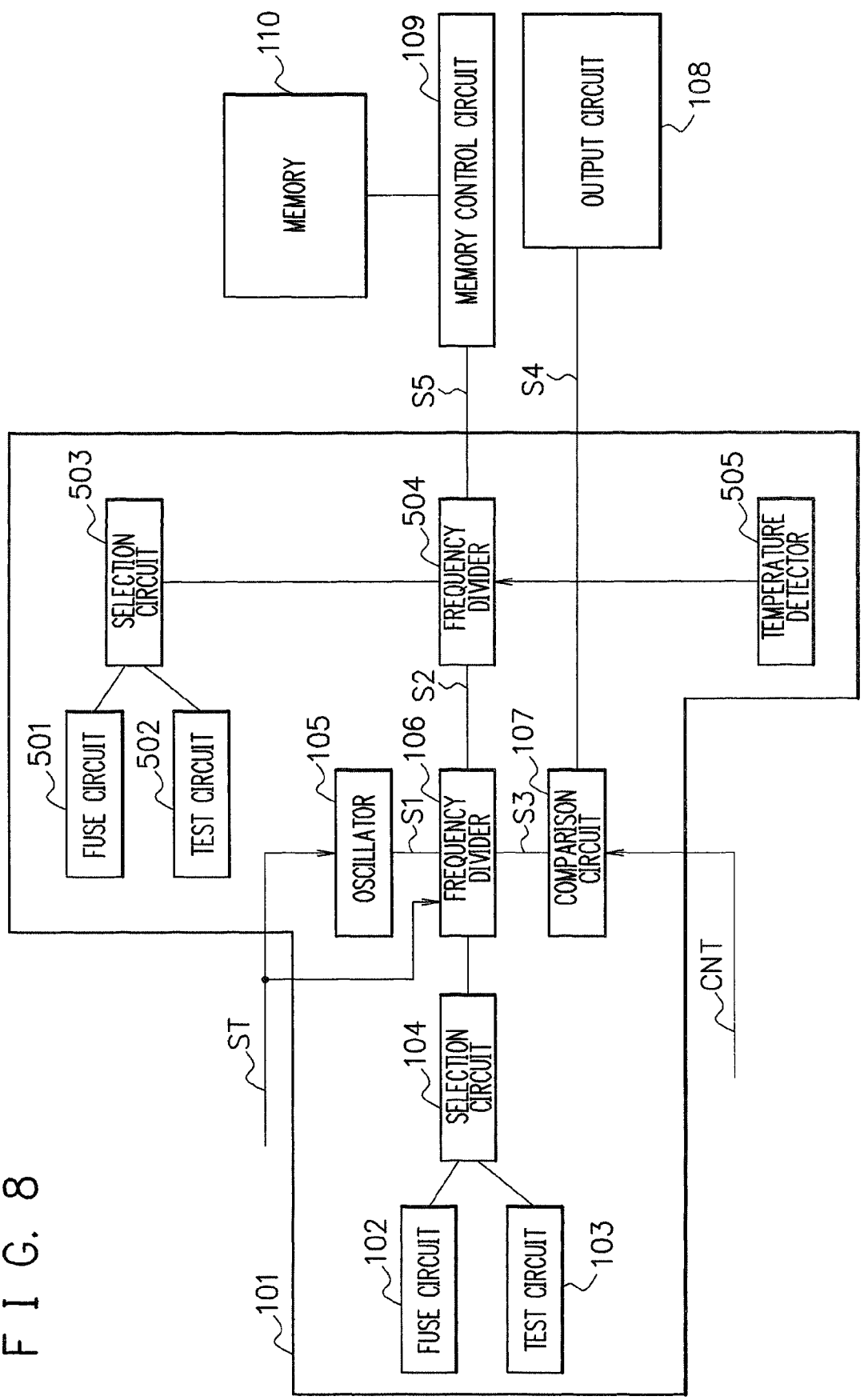
FIG. 8 is a block diagram showing a structural example of a memory according to a third embodiment.

FIG. 8 is a block diagram showing a structural example of a memory according to the third embodiment. The present embodiment (FIG. 8) is prepared by adding a fuse circuit 501, a test circuit 502, a selection circuit 503, a frequency divider 504 and a temperature detector 505 to the first embodiment (FIG. 4). The features of the present embodiment different from the first embodiment will be explained below.

The fuse circuit 102, the test circuit 103 and the selection circuit 104 are a first setting unit setting the frequency division number of the first frequency divider 106. The fuse circuit 501, the test circuit 502 and the selection circuit 503 are a second setting unit setting the frequency division number of the second frequency divider 504.

The fuse circuit 102 and the test circuit 103 output a frequency division number for times of high temperatures. In test mode, the selection circuit 104 selects a frequency division number outputted by the test circuit 103 and outputs it to the frequency divider 106. The frequency divider 106 counts the oscillation number of the oscillation signal S1 and outputs the count value S3. Similarly to the first embodiment, a frequency division number for times of high temperatures is determined based on the detected count value S3 and is written into the fuse circuit 102.

The fuse circuit 501 and the test circuit 502 output the frequency division number at low temperatures. A frequency division number multiplied by the coefficient of a frequency division number written into the fuse circuit 102 is written in the fuse circuit 501. The selection circuit 503 selects a frequency division number outputted by the test circuit 502 in test mode, selects a frequency division number outputted by the fuse circuit 501 in normal mode and outputs it into the frequency divider 504. The temperature detector 505 detects temperatures. When the temperature detected by the temperature detector 505 is lower than the threshold value, the second frequency divider 504 divides the refresh request signal (the first frequency division signal) S2 outputted by the first frequency divider 106 by a frequency division number outputted by the selection circuit 503 and outputs the refresh request signal (the second frequency division signal) S5, and when the temperature detected by the temperature detector 505 is higher than the threshold value, it outputs the refresh request signal S2 as the refresh request signal S5. The frequency divider 504 outputs the refresh request signal for times of high temperature and outputs the refresh request signal for times of low temperature according to the temperature detected. At the times of high temperature, the frequency division number is small and the cycle of the refresh request signal S5 is shorter. At times of low temperatures, the frequency division number is large and the cycle of the refresh request signal S5 is longer. The memory control circuit 109 performs a refresh operation on the memory 110 based on the refresh request signal S5.

Note that it is also possible that the frequency divider 504 counts the oscillation number of the refresh request signal S2 similarly to the frequency divider 106, the comparison circuit 107 compares the count value of the frequency divider 504 and a reference number CNT to output a comparison result signal to the output circuit 108, so that the frequency division number at the times of low temperatures is determined based on a count value of the frequency divider 504 similarly to the first embodiment and may be written into the fuse circuit 501.

Figure 9:
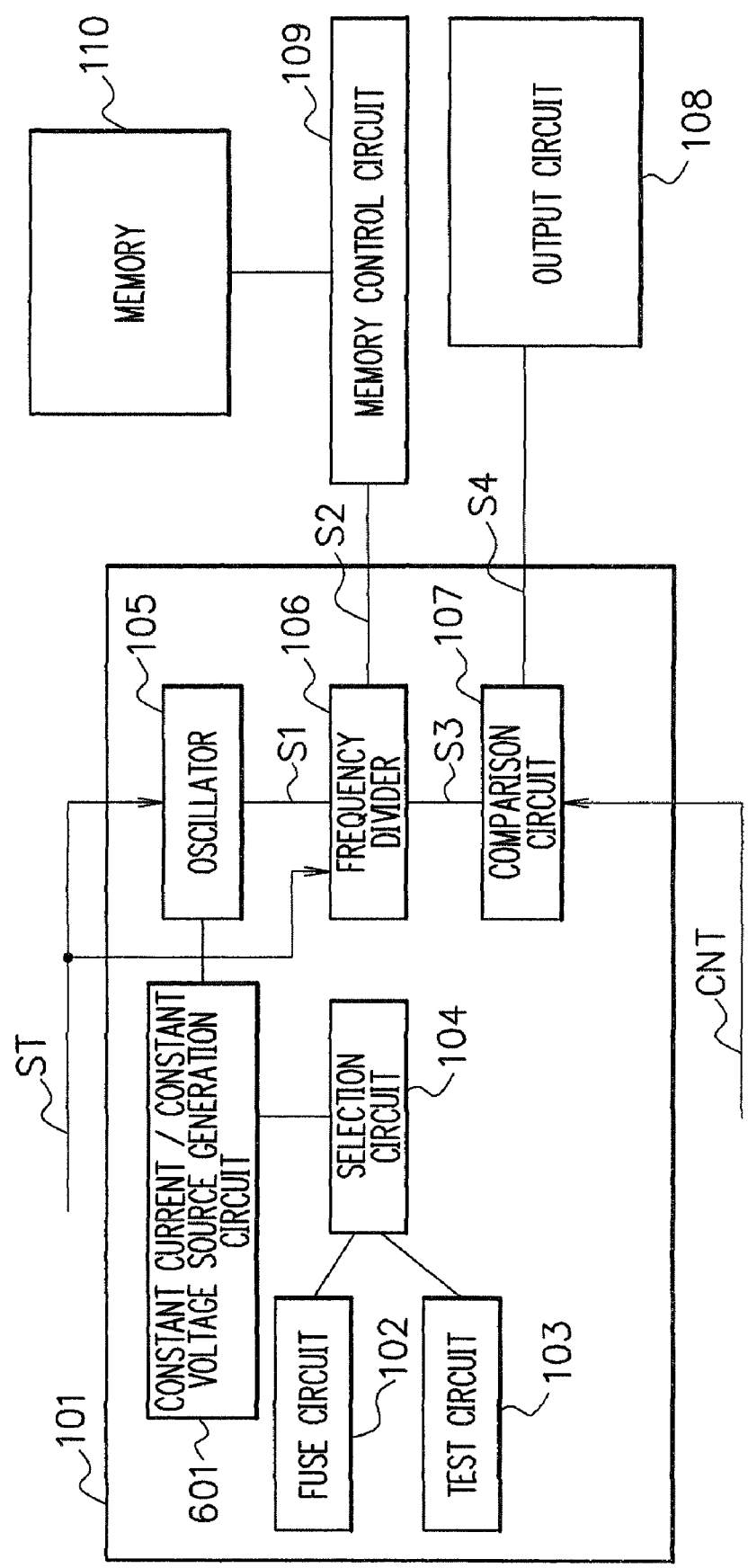
FIG. 9 is a block diagram showing a structural example of a memory according to a fourth embodiment.

FIG. 9 is a block diagram showing a structural example of a memory according to the fourth embodiment. The present embodiment (FIG. 9) is prepared by adding a constant-current/constant-voltage source generation circuit 601 to the first embodiment (FIG. 4). The features of the present embodiment different from the first embodiment will be explained below. Although the cycle of the refresh request signal S2 is adjusted by controlling the frequency division number in the first embodiment, the present embodiment adjusts the cycle of the refresh request signal S2 by controlling the constant-current value or the constant-voltage value.

The fuse circuit 102 and the test circuit 103 output the indicating signal of a constant-current value or a constant-voltage value to the constant-current/constant-voltage source generation circuit 601 via the selection circuit 104. The constant-current/constant-voltage source generation circuit 601 generates the constant current or constant voltage of an indicated constant-current value or a constant-voltage value. The oscillator 105 generates the oscillation signal S1 at the cycle corresponding to a generated constant current or a constant voltage. The cycle of the oscillation signal S1 changes in response to the constant current or the constant voltage. The frequency divider 106 divides the oscillation signal S1 to output the refresh request signal S2, and counts the oscillation signal S3 to output the count value S3. Other operations are the same as the first embodiment.

Figure 10:
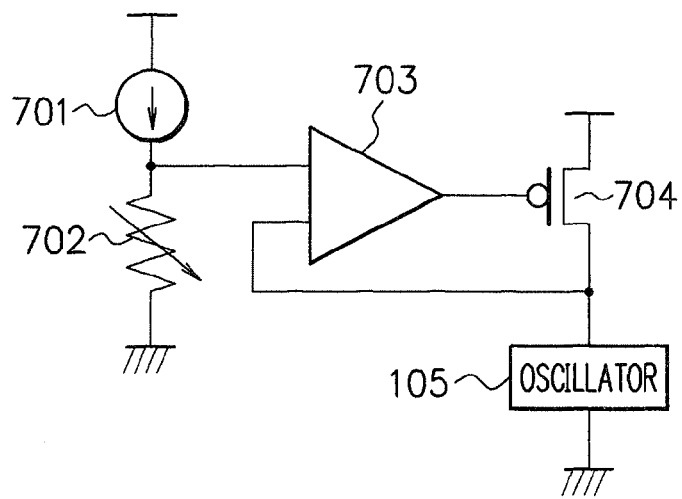
FIG. 10 is a circuit diagram showing a structural example of a constant-voltage generation circuit and an oscillator.

FIG. 10 is a circuit diagram showing a structural example of the constant-voltage generation circuit 601 and the oscillator 105. A current source 701 and a variable resistance 702 are connected between the source voltage and the reference potential in series. A comparator 703 outputs a comparison result between the voltage of the variable resistance 702 and the voltage of the oscillator 105. A p-channel MOS field effect transistor 704 is connected to the source voltage at the source, is connected to an output terminal of the comparator 703 at the gate and is connected to the oscillator 105 at a drain. By changing the resistance value of the variable resistance 702, it is possible to control the constant-voltage value supplied to the oscillator 105. The oscillator 105 generates an oscillation signal at a cycle in response to the constant-voltage value.

Figure 11:
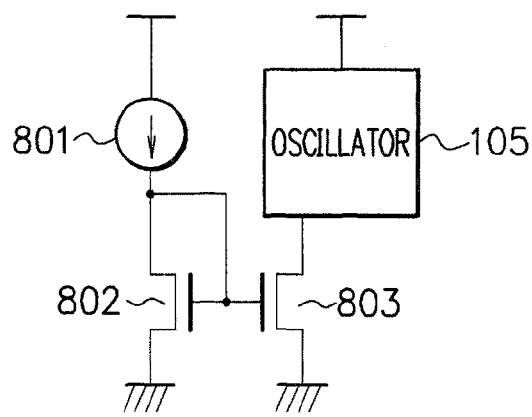
FIG. 11 is a circuit diagram showing a structural example of a constant-current generation circuit and an oscillator.

FIG. 11 is a circuit diagram showing a structural example of the constant-current generation circuit 601 and the oscillator 105. An n-channel MOS field effect transistor 802 is connected to a reference potential at the source and is connected to the source voltage via a current source 801 at the gate and a drain. An n-channel MOS field effect transistor 803 is connected to a reference potential at the source, is connected to a gate of the transistor 802 at the gate and is connected to the source voltage at a drain via the oscillator 105. A channel width (gate width) of the transistor 803 is an integral multiple of the channel width of the transistor 802, and is variable. More concretely, the transistor 803 is composed of parallel connection of plural transistors, and the channel width can be controlled by changing the number of parallel connections. By changing the channel width of the transistor 803, it is possible to control a constant-current value supplied to the oscillator 105. The oscillator 105 generates an oscillation signal in a cycle in response to the constant-current value.

Figure 12:
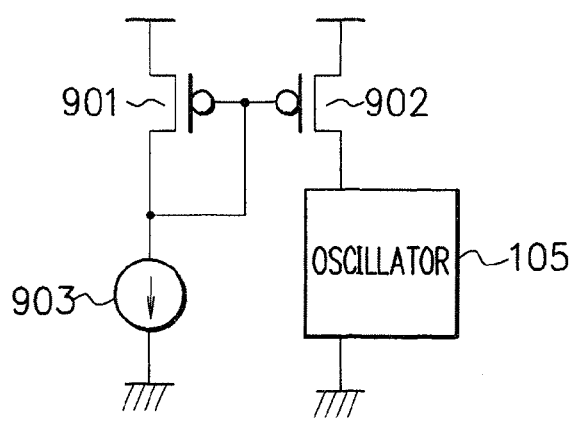
FIG. 12 is a circuit diagram showing a structural example of another constant-current generation circuit and an oscillator.

FIG. 12 is a circuit diagram showing a structural example of another constant-current generation circuit 601 and the oscillator 105. The source of a p-channel MOS field effect transistor 901 is connected to a source voltage, and the gate and the drain thereof are connected to a reference potential via the current source 903. The source of a p-channel MOS field effect transistor 902 is connected to a source voltage, the gate thereof is connected to the gate of the transistor 901 and the drain is connected to the reference potential via the oscillator 105. The channel width of the transistor 902 is an integral multiple of the channel width of the transistor 901, and is variable. More concretely, the transistor 902 is composed of the parallel connection of plural transistors, and the channel width can be controlled by changing the number of parallel connections. By changing the channel width of the transistor 902, it is possible to control a constant-current value supplied to the oscillator 105. The oscillator 105 generates an oscillation signal at a cycle in response to a constant-current value.

The present embodiment can measure the cycle of the oscillation signal S1 by one time of measurement with high accuracy, and variation of the cycle of the refresh request signal S2 can be prevented with ease similarly to the first embodiment.

By examining a reference number that coincides with the counted oscillation number, it is possible to easily measure the oscillation number of an oscillation signal. Thereby, it becomes possible to prevent the variations in the cycle of the oscillation signal.

The present embodiments are to be considered in all respects as illustrative and no restrictive, and all changes that come within the meaning and range of equivalency of the claims are therefore intended to be embraced therein. The invention may be embodied in other specific forms without departing from the spirit or essential characteristics thereof.

What is claimed is:

1. An oscillating device comprising:
    an oscillator generating an oscillation signal according to an enable signal;
    a frequency divider generating a frequency division signal generated by dividing the oscillation signal;
    a counter counting an oscillation number of the oscillation signal and setting at the oscillation number indicated by another signal;
    a comparator comparing the counted oscillation number and a reference number; and
    a setting unit setting a frequency division number of the frequency divider, wherein the counter is included in the frequency divider.

2. The oscillating device according to claim 1, wherein the oscillation signal is for generating a refresh request signal of a memory.

3. The oscillating device according to claim 1, wherein the setting unit sets the frequency division number of the frequency divider according to temperatures.

4. The oscillating device according to claim 1, further comprising:
    a temperature detector detecting a temperature,
    wherein said setting unit sets a frequency division number of the frequency divider according to said detected temperature.

5. The oscillating device according to claim 1, wherein said setting unit includes a fuse circuit storing said frequency division number.

6. An oscillating device, comprising:
    an oscillator generating an oscillation signal according to an enable signal;
    a first frequency divider generating a first frequency division signal generated by dividing the oscillation signal;
    a counter counting an oscillation number of the oscillation signal and resetting at an oscillation number indicated by another signal;
    a comparator comparing the counted oscillation number and a reference number;
    a second frequency divider generating a second frequency division signal by dividing the first frequency division signal and outputting the first frequency division signal or the second frequency division signal according to a temperature;
    a first setting unit setting a frequency division number of the first frequency divider; and
    a second setting unit setting a frequency division number of the second frequency divider,
    wherein the counter is included in the first frequency divider.

7. A method of adjusting an oscillating device, the method comprising:
    oscillating to generate an oscillation signal with an oscillator according to an enable signal;
    counting an oscillation number of the oscillation signal with a counter, and selecting whether or not to reset at the oscillation number indicated by another signal;
    comparing the counted oscillation number and a reference number with a comparator;
    generating a first frequency division signal by dividing the oscillation signal with a first frequency divider; and
    setting a frequency division number of the first frequency divider according to the comparison result.

8. The method of adjusting the oscillating device according to claim 7, further comprising:
    performing the oscillation, the counting, and the comparison to set the frequency division number at a first temperature; and
    performing the oscillation, the counting, and the comparison to set the frequency division number at a second temperature.

9. The method of adjusting the oscillating device according to claim 7, further comprising:
    generating a second frequency division signal by dividing the first frequency division signal with a second frequency divider; and
    outputting the first frequency division signal or the second frequency division signal according to a temperature.

10. The method of adjusting the oscillating device according to claim 7, further comprising:
    writing the frequency division number in a fuse circuit.

11. The method of adjusting the oscillating device according to claim 7, wherein the oscillation signal is for generating a refresh request signal of a memory.

* * * * *